(12) United States Patent
Hong et al.

(10) Patent No.: US 12,439,795 B2
(45) Date of Patent: Oct. 7, 2025

(54) DISPLAY DEVICE

(71) Applicant: LG Display Co., Ltd., Seoul (KR)

(72) Inventors: Seungpyo Hong, Busan (KR); JungSun Baek, Paju-si (KR); Seongjoo Lee, Goyang-si (KR); ChangHyun Song, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 543 days.

(21) Appl. No.: 17/896,908

(22) Filed: Aug. 26, 2022

(65) Prior Publication Data

US 2023/0120937 A1 Apr. 20, 2023

(30) Foreign Application Priority Data

Oct. 20, 2021 (KR) .................. 10-2021-0139987

(51) Int. Cl.
*H10K 59/35* (2023.01)
*H10K 50/844* (2023.01)
*H10K 59/122* (2023.01)
*H10K 59/38* (2023.01)

(52) U.S. Cl.
CPC ......... *H10K 59/353* (2023.02); *H10K 50/844* (2023.02); *H10K 59/122* (2023.02); *H10K 59/38* (2023.02)

(58) Field of Classification Search
None
See application file for complete search history.

(56) References Cited

U.S. PATENT DOCUMENTS

| 11,164,927 B2* | 11/2021 | Sim | H10K 59/124 |
| 11,355,565 B2* | 6/2022 | Beak | H10K 50/822 |
| 2015/0144919 A1* | 5/2015 | Matsumoto | H10K 59/38 |
| | | | 257/40 |
| 2022/0223664 A1* | 7/2022 | Kim | H10K 59/80522 |

FOREIGN PATENT DOCUMENTS

| KR | 10-2012-0100813 A | 9/2012 |
| KR | 10-2015-0006605 A | 1/2015 |
| KR | 10-2016-0077415 A | 7/2016 |
| KR | 10-2018-0013605 A | 2/2018 |
| KR | 10-2021-0017056 A | 2/2021 |

* cited by examiner

*Primary Examiner* — Michelle Mandala
(74) *Attorney, Agent, or Firm* — Birch, Stewart, Kolasch & Birch, LLP (57) ABSTRACT

A display device can include a substrate including a plurality of sub-pixels, an overcoating layer on the substrate and including a base portion and protrusion portions, a first electrode corresponding to each of the plurality of sub-pixels and covering the base portion and the protrusion portions, a bank on a portion of the first electrode, an organic layer on the first electrode and the bank, a second electrode on the organic layer, an encapsulation unit on the second electrode, and a color filter on the encapsulation unit. The color filter can overlap another portion of the first electrode that is exposed by the bank. Therefore, it is possible to improve a luminance viewing angle and lateral visibility by disposing the color filter to overlap the emission area alone.

20 Claims, 7 Drawing Sheets

DISPLAY DEVICE

CROSS-REFERENCE TO RELATED APPLICATIONS

This application claims the benefit of and priority to Korean Patent Application No. 10-2021-0139987 filed on Oct. 20, 2021, in the Republic of Korea, the entire contents of which are hereby expressly incorporated by reference into the present application.

BACKGROUND OF THE DISCLOSURE

Technical Field

The present disclosure relates to a display device, and more particularly, to a display device providing improvement in luminance viewing angle.

Discussion of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Among these various display devices, an organic light emitting display device is a self-light emitting display device, and can be manufactured to be light and thin since it does not require a separate light source, unlike a liquid crystal display device having a separate light source.

In addition, the organic light emitting display device has advantages in terms of power consumption due to a low voltage driving, and is excellent in terms of a color implementation, a response speed, a viewing angle, and a contrast ratio (CR). Therefore, light emitting display devices are expected to be utilized in various fields.

SUMMARY OF THE DISCLOSURE

An aspect of the present disclosure is to provide a display device capable of increasing light efficiency of an organic light emitting element and reducing power consumption by using an anode having a side mirror shape.

Another aspect of the present disclosure is to provide a display device in which a luminance viewing angle is improved and visibility at a lateral side is improved by disposing a color filter layer on an upper portion of an emission area.

Objects of the present disclosure are not limited to the above-mentioned objects, and other objects, which are not mentioned above, can be clearly understood by those skilled in the art from the following descriptions.

According to an aspect of the present disclosure, a display device can include a substrate including a plurality of sub-pixels, an overcoating layer on the substrate and including a base portion and protrusion portions, a first electrode corresponding to each of the plurality of sub-pixels and covering the base portion and the protrusion portions, a bank on a portion of the first electrode, an organic layer on the first electrode and the bank, a second electrode on the organic layer, an encapsulation unit on the second electrode, and a color filter on the encapsulation unit. The color filter overlaps another portion of the first electrode that is exposed by the bank. Accordingly, it is possible to improve a luminance viewing angle and lateral visibility by disposing the color filter only on the upper portion of the emission area.

According to another aspect of the present disclosure, in a display device, the plurality of sub-pixels can include a red sub-pixel, a green sub-pixel, and a blue sub-pixel, and the color filter can be disposed only in the emission area of the green sub-pixel among the plurality of sub-pixels. Accordingly, when white light is implemented, since the ratio of green light emitted from the green sub-pixel is greatest, a luminance viewing angle for white color can be improved and lateral visibility can be improved.

According to yet another aspect of the present disclosure, in a display device, the color filter can be disposed only in a portion of the emission area of the green sub-pixel among the plurality of sub-pixels. Accordingly, the luminance viewing angle for white color can be improved, lateral visibility can be improved, and a desired luminance viewing angle can be provided by adjusting an area of the color filter.

Other detailed matters of the exemplary embodiments are included in the detailed description and the drawings.

According to one or more embodiments of the present disclosure, light extraction efficiency of a light emitting display device can be improved by using an anode having a side mirror shape.

According to one or more embodiments of the present disclosure, by disposing a color filter layer only on an upper portion of an emission area, a luminance viewing angle can be improved, and lateral visibility can be improved.

The effects according to the present disclosure are not limited to the contents exemplified above, and more various effects are included in the present specification.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components, and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to accompanying drawings. All the components of each display device according to all embodiments of the present disclosure are operatively coupled and configured.

Figure 1:
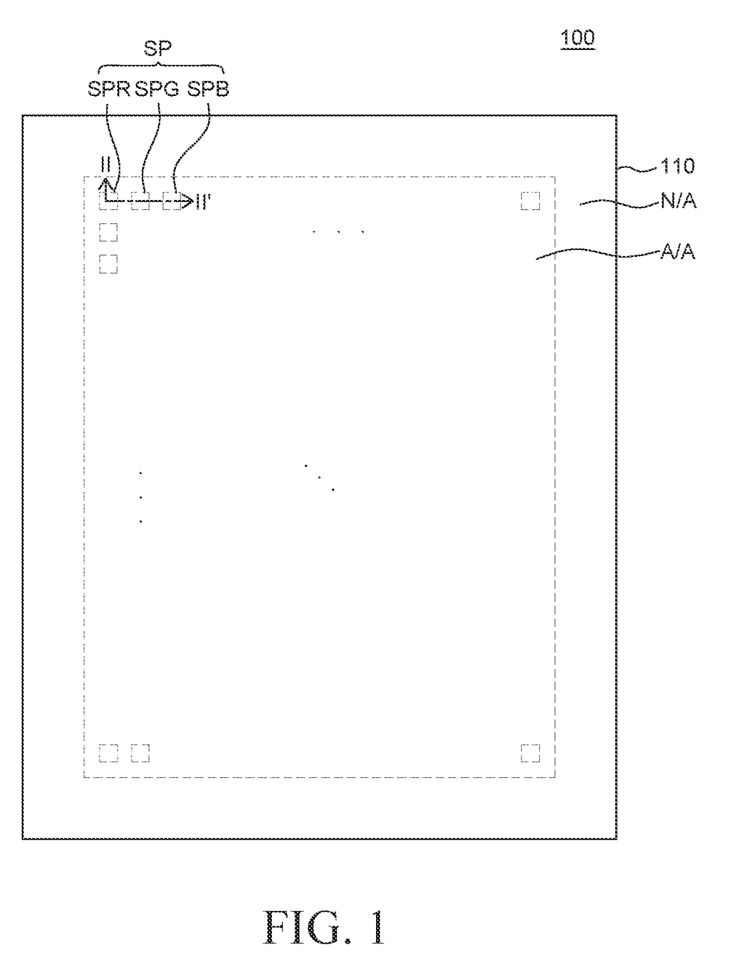
FIG. 1 is a plan view of a display device according to an exemplary embodiment of the present disclosure.
Figure 2:
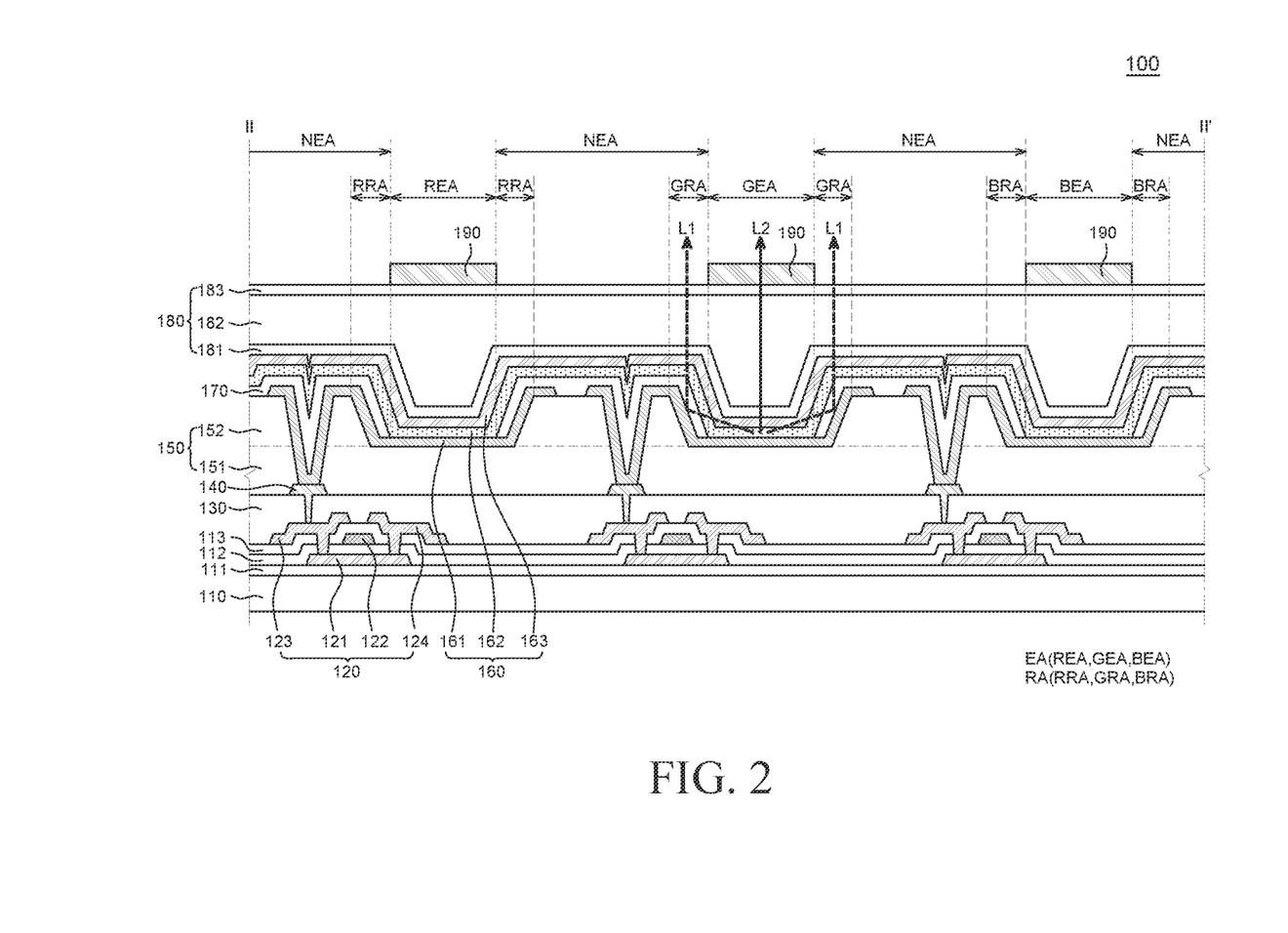
FIG. 2 is a cross-sectional view of the display device taken along line II-II' of FIG. 1.

FIG. 1 is a plan view of a display device according to an exemplary embodiment of the present disclosure. FIG. 2 is a cross-sectional view of the display device taken along II-II' of FIG. 1.

Referring to FIGS. 1 and 2, a display device 100 includes a substrate 110, transistors 120, a first overcoating layer 130, an auxiliary electrode 140, a second overcoating layer 150, light emitting elements 160, banks 170, an encapsulation unit 180, and color filters 190. The display device 100 can be implemented as a top emission type display device, but is not limited thereto.

The substrate 110 is a substrate for supporting and protecting various components of the display device 100. The substrate 110 can be formed of glass or a plastic material having flexibility. When the substrate 110 is formed of a plastic material, it can be formed of, for example, polyimide (PI). However, the present disclosure is not limited thereto.

The substrate 110 includes an active area A/A and a non-active area N/A.

The active area A/A is an area in which an image is displayed in the display device 100, and a display element and various driving elements for driving the display element can be disposed in the active area A/A. For example, the display element can be configured as the light emitting element 160 including a first electrode 161, an organic layer 162, and a second electrode 163. In addition, various driving elements for driving the display element, such as the transistor 120, a capacitor, and lines can be disposed in the active area A/A.

A plurality of sub-pixels SP can be included in the active area A/A. The sub-pixels SP are minimum units constituting a screen, and each of the plurality of sub-pixels SP can include the light emitting element 160 and a driving circuit.

Each of the plurality of sub-pixels SP can emit light of different wavelengths. For example, the plurality of sub-pixels SP can include a red sub-pixel SPR, a green sub-pixel SPG, and a blue sub-pixel SPB. In addition, the plurality of sub-pixels SP can further include a white sub-pixel.

The driving circuit of the sub-pixel SP is a circuit for controlling driving of the corresponding light emitting element 160. For example, the driving circuit can be configured to include the transistor 120 and a capacitor, but is not limited thereto.

The non-active area N/A is an area in which an image is not displayed, and various components for driving the plurality of sub-pixels SP disposed in the active area A/A can be disposed in the non-active area N/A. For example, a driver IC, a flexible film, and the like that supply signals for driving the plurality of sub-pixels SP can be disposed.

The non-active area N/A can be an area surrounding the active area A/A as shown in FIG. 1. However, the present disclosure is not limited thereto. For example, the non-active area N/A can be an area extending from the active area A/A.

Hereinafter, the plurality of sub-pixels SP disposed in the active area A/A will be described in more detail with reference to FIG. 2.

A buffer layer 111 is disposed on the substrate 110. The buffer layer 111 can serve to improve adhesion between layers formed on the buffer layer 111 and the substrate 110, and to block alkali components or the like leaking from the substrate 110. The buffer layer 111 can be formed of a single layer of silicon nitride (SiNx) or silicon oxide (SiOx), or multilayers of silicon nitride (SiNx) or silicon oxide (SiOx), but is not limited thereto. The buffer layer 111 is not an essential component and can be omitted based on a type and a material of the substrate 110, a structure and a type of the transistor 120, and the like.

The transistor 120 is disposed on the buffer layer 111. The transistor 120 can be used as a driving element for driving the light emitting element 160 of the active area A/A. The transistor 120 includes an active layer 121, a gate electrode 122, a source electrode 123, and a drain electrode 124. As a variation, the source and drain electrodes 123 can be switched in that the source electrode can the drain electrode and the drain electrode can be the source electrode. The transistor 120 is a driving transistor and is a thin film transistor having a top gate structure in which the gate electrode 122 is disposed on the active layer 121. However, the present disclosure is not limited thereto, and the transistor 120 can be implemented as a transistor having a bottom gate structure.

The active layer 121 is disposed on the buffer layer 111. The active layer 121 is an area in which a channel is formed when the transistor 120 is driven. The active layer 121 can be formed of an oxide semiconductor, or can be formed of amorphous silicon (a-Si), polycrystalline silicon (poly-Si), or an organic semiconductor.

A gate insulating layer 112 is disposed on the active layer 121. The gate insulating layer 112 is a layer for electrically insulating the active layer 121 and the gate electrode 122 and can be formed of an insulating material. For example, the gate insulating layer 112 can be formed of a single layer of silicon nitride (SiNx) or silicon oxide (SiOx), which is an inorganic material, or multilayers of silicon nitride (SiNx) or silicon oxide (SiOx), but is not limited thereto.

In the gate insulating layer 112, contact holes through which the source electrode 123 and the drain electrode 124 contact a source area and a drain area of the active layer 121, respectively, are formed. The gate insulating layer 112 can be formed over an entire surface of the substrate 110 as shown in FIG. 2, or can be patterned to have the same width as the gate electrode 122, but is not limited thereto.

The gate electrode 122 is disposed on the gate insulating layer 112. The gate electrode 122 is disposed on the gate insulating layer 112 to overlap a channel area of the active layer 121. The gate electrode 122 can be formed of any one of various metallic materials, for example, molybdenum (Mo), aluminum (Al), chrome (Cr), gold (Au), titanium (Ti), nickel (Ni), neodymium (Nd), and copper (Cu) or an alloy of two or more of them, or a multiple layer thereof, but is not limited thereto.

An interlayer insulating layer 113 is disposed on the gate electrode 122. The interlayer insulating layer 113 can be formed of a single layer of silicon nitride (SiNx) or silicon oxide (SiOx), which is an inorganic material, or multilayers of silicon nitride (SiNx) or silicon oxide (SiOx), but is not limited thereto. In the interlayer insulating layer 113, contact holes through which the source electrode 123 and the drain electrode 124 contact the source area and the drain area of the active layer 121, respectively, are formed.

The source electrode 123 and the drain electrode 124 are disposed on the interlayer insulating layer 113. The source electrode 123 and the drain electrode 124 are spaced apart from each other on the same layer. The source electrode 123 and the drain electrode 124 are electrically connected to the active layer 121 through the contact holes of the gate insulating layer 112 and the interlayer insulating layer 113. The source electrode 123 and the drain electrode 124 can be formed of any one of various metallic materials, for example, molybdenum (Mo), aluminum (Al), chrome (Cr), gold (Au), titanium (Ti), nickel (Ni), neodymium (Nd), and copper (Cu) or an alloy of two or more of them, or a multiple layer thereof, but is not limited thereto.

In FIG. 2, only the driving transistor among various types of transistors 120 included in the display device 100 is illustrated, but other transistors such as a switching transistor and the like can also be disposed.

The first overcoating layer 130 is disposed on the interlayer insulating layer 113 and the transistor 120. The first overcoating layer 130 is an insulating layer for protecting the transistor 120 and planarizing an upper portion of the transistor 120. A contact hole for exposing the source electrode 123 of the transistor 120 is formed in the first overcoating layer 130. Although it is illustrated in FIG. 2 that a contact hole for exposing the source electrode 123 is formed in the first overcoating layer 130, the present disclosure is not limited thereto. For example, a contact hole for exposing the drain electrode 124 can be formed in the first overcoating layer 130.

The first overcoating layer 130 can be formed of one of an acrylic resin, an epoxy resin, a phenol resin, a polyamide-based resin, a polyimide-based resin, an unsaturated polyester-based resin, a polyphenylene-based resin, a polyphenylene sulfide-based resin, benzocyclobutene, and a photoresist, but is not limited thereto.

Meanwhile, a passivation layer covering the interlayer insulating layer 113 and the transistor 120 can be further disposed under the first overcoating layer 130. The passivation layer can be formed of a single layer of silicon nitride (SiNx) or silicon oxide (SiOx), or multilayers of silicon nitride (SiNx) or silicon oxide (SiOx), but is not limited thereto.

The auxiliary electrode 140 is disposed on the first overcoating layer 130. The auxiliary electrode 140 can serve to electrically connect the transistor 120 and the light emitting element 160. The auxiliary electrode 140 is electrically connected to the source electrode 123 of the transistor 120 through the contact hole formed in the first overcoating layer 130. The auxiliary electrode 140 can be formed as a single layer or multiple layers formed of any one of molybdenum (Mo), copper (Cu), titanium (Ti), aluminum (Al) chromium (Cr), gold (Au), nickel (Ni), and neodymium (Nd) or alloys of them.

The second overcoating layer 150 is disposed on the first overcoating layer 130. The second overcoating layer 150 is an insulating layer for planarizing upper portions of the first overcoating layer 130 and the auxiliary electrode 140. A contact hole for exposing the auxiliary electrode 140 is formed in the second overcoating layer 150.

The second overcoating layer 150 can be formed of one of an acrylic resin, an epoxy resin, a phenol resin, a polyamide-based resin, a polyimide-based resin, an unsaturated polyester-based resin, a polyphenylene-based resin, a polyphenylene sulfide-based resin, benzocyclobutene, and a photoresist, but is not limited thereto.

The second overcoating layer 150 includes a base portion 151 and a plurality of protrusion portions 152. The base portion 151 and the plurality of protrusion portions 152 can be integrally formed as shown in FIG. 2. For example, the base portion 151 and the plurality of protrusion portions 152 can be formed of the same material and can be simultaneously formed through the same process, for example, a mask process, but is not limited thereto.

The base portion 151 is disposed on the first overcoating layer 130. An upper surface of the base portion 151 has a surface parallel to the substrate 110. Accordingly, the base portion 151 can planarize a step that can occur due to components disposed thereunder.

The plurality of protrusion portions 152 are disposed on the base portion 151. The plurality of protrusion portions 152 are integrally formed with the base portion 151 and have a shape protruding from the base portion 151. The plurality of protrusion portions 152 can have a shape in which an upper surface thereof is smaller than a lower surface thereof, but is not limited thereto.

Each of the plurality of protrusion portions 152 includes the upper surface and side surfaces. The upper surface of the protrusion portion 152 is a surface positioned at an uppermost portion of the protrusion portion 152 and can be a surface substantially parallel to the base portion 151 or the substrate 110. The side surfaces of the protrusion portion 152 can be surfaces connecting the upper surface of the protrusion portion 152 and the base portion 151. The side surface of the protrusion portion 152 can have a shape inclined toward the base portion 151 from the upper surface thereof.

The light emitting element 160 is disposed on the second overcoating layer 150. The light emitting element 160 includes the first electrode 161 electrically connected to the source electrode 123 of the transistor 120, the organic layer 162 disposed on the first electrode 161, and the second electrode 163 formed on the organic layer 162.

The first electrode 161 is disposed to correspond to each of the plurality of sub-pixels SP. The first electrode 161 is disposed to cover the base portion 151 and the plurality of protrusion portions 152. The first electrode 161 can be disposed along shapes of the base portion 151 and the plurality of protrusion portions 152 of the planarization layer.

Specifically, the first electrode 161 can be disposed on the upper surface of the base portion 151 on which the protrusion portions 152 are not disposed and on the side surfaces of the plurality of protrusion portions 152. For example, the first electrode 161 is disposed along shapes of the base portion 151 and the protrusion portions 152. Also, the first electrode 161 can be formed on partial areas of the upper surfaces of the plurality of protrusion portions 152.

The first electrode 161 can be an anode of the light emitting element 160. The first electrode 161 is electrically connected to the auxiliary electrode 140 through the contact hole formed in the second overcoating layer 150. The first electrode 161 can be electrically connected to the source electrode 123 of the transistor 120 through the auxiliary electrode 140. However, the first electrode 161 can be configured to be electrically connected to the drain electrode 124 of the transistor 120 according to the type of the transistor 120 and a design method of the driving circuit.

Although the first electrode 161 is a single layer in FIG. 2, the first electrode 161 can be configured as a multilayer. For example, the first electrode 161 can include a reflective layer for reflecting light emitted from the organic layer 162 toward the second electrode 163 and a transparent conductive layer for supplying holes to the organic layer 162.

The reflective layer can be disposed on the second overcoating layer 150 and reflect light emitted from the light emitting element 160 upwardly. The light generated in the organic layer 162 of the light emitting element 160 may not be emitted only upwardly, but can also be emitted laterally. The laterally emitted light can be directed into the display device 100, and can be trapped inside the display device 100 due to total reflection, and further can disappear while traveling in an inward direction of the display device 100. Accordingly, the reflective layer is disposed under the organic layer 162 to cover side portions of the plurality of protrusion portions 152, and can change a traveling direction of light traveling toward a side portion of the organic layer 162 to a front direction.

The reflective layer can be formed of a metallic material, for example, can be formed of a metallic material such as aluminum (Al), silver (Ag), copper (Cu), magnesium-silver alloy (Mg:Ag) or the like, but is limited thereto.

The transparent conductive layer is disposed on the reflective layer. The transparent conductive layer can be formed of a conductive material having a high work function in order to supply holes to the organic layer 162. For example, the transparent conductive layer can be formed of indium tin oxide (ITO), indium zinc oxide (IZO), indium tin zinc oxide (ITZO), zinc oxide (ZnO), and tin oxide (TO)-based transparent conductive oxides, but is not limited thereto.

The banks 170 are disposed on the second overcoating layer 150 and the first electrodes 161. The banks 170 are insulating layers for separating the sub-pixels SP adjacent to each other. The bank 170 can be disposed to open a portion of the first electrode 161 and form an opening area, and the bank 170 can form a non-opening area covering a portion of the first electrode 161 to thereby define emission areas EA and non-emission areas NEA.

The emission area EA can refer to an area in which light is directly generated by the organic layer 162 in each of the plurality of sub-pixels SP. The emission area EA is or can correspond to an opening area of the bank 170, in which the bank 170 is not disposed and the organic layer 162 is directly positioned on the first electrode 161 to generate light. The emission areas EA can be divided into an emission area REA of a red sub-pixel SPR, an emission area BEA of a blue sub-pixel SPB, and an emission area GEA of a green sub-pixel SPG.

The non-emission area NEA can be referred to an area in which light is not directly generated. The non-emission area NEA is or can correspond to a non-opening area of the bank 170, in which the bank 170 is disposed between the first electrode 161 and the organic layer 162 to thereby block direct light generation.

The non-emission area NEA can include a reflective area RA. Here, the reflective area RA is an area corresponding to a side surface of the bank 170 on which the first electrode 161 is disposed, and is an area in which a reflective layer of the first electrode 161 formed on a side portion of the protrusion portion 152 functions as a side mirror, so that a portion of light that can be trapped within the display device 100 can be extracted to the outside of the display device 100 due to total reflection.

The reflective areas RA can be divided into a reflective area RRA of the red sub-pixel SPR, a reflective area BRA of the blue sub-pixel SPB, and a reflective area GRA of the green sub-pixel SPG.

The banks 170 can be formed of an inorganic material. For example, the banks 170 can be formed of a single layer of silicon nitride (SiNx) or silicon oxide (SiOx), or multiple layers of silicon nitride (SiNx) or silicon oxide (SiOx).

The organic layer 162 is disposed on the first electrodes 161 and the banks 170. For example, the organic layer 162 is disposed on the first electrode 161 in the emission area EA and is disposed on the bank 170 in the non-emission area NEA. The organic layer 162 can be disposed along shapes of the first electrode 161 and the bank 170. The organic layer 162 includes an emission layer and a common layer.

The emission layer is an organic layer for emitting light of a specific color. Different emission layers can be disposed in each of the plurality of sub-pixels SP, or the same emission layer can be disposed in an entirety of the plurality of sub-pixels SP. For example, when different emission layers are disposed in each of the plurality of sub-pixels SP, a red emission layer can be disposed in the red sub-pixel SPR, a green emission layer can be disposed in the green sub-pixel SPG, and a blue emission layer can be disposed in the blue sub-pixel SPB. When the emission layer is formed as the same layer over the plurality of sub-pixels SP, light from the emission layer can be converted into light of various colors through a separate light conversion layer, a color filter, and the like.

The common layer is an organic layer disposed to improve luminous efficiency of the emission layer. The common layer can be formed as the same layer over the plurality of sub-pixels SP. For example, the common layer of each of the plurality of sub-pixels SP can be simultaneously formed of the same material and through the same process. The common layer can include a hole injection layer, a hole transport layer, an electron transport layer, an electron injection layer, and a charge generation layer, but is not limited thereto.

The second electrode 163 is disposed on the organic layer 162. The second electrode 163 can be disposed along the shape of the organic layer 162. Since the second electrode 163 supplies electrons to the organic layer 162, it can be formed of a conductive material having a low work function. The second electrode 163 can be a cathode of the light emitting element 160. The second electrode 163 can be formed of a transparent conductive material such as indium tin oxide (ITO) or indium zinc oxide (IZO), or a metal alloy such as MgAg or an ytterbium (Yb) alloy, and can further include a metal-doped layer, but is not limited thereto. The second electrode 163 can be electrically connected to a low potential power line and receive a low potential power signal.

The light emitting element 160 can have a structure for realizing a micro-cavity effect. The microcavity means that light of a specific wavelength is amplified by constructive interference as light is repeatedly reflected between two layers spaced apart from each other by an optical length. When this microcavity is applied to the light emitting element 160, light emitted from the organic layer 162 is repeatedly reflected between the first electrode 161 and the second electrode 163, so that constructive interference with respect to light of a specific wavelength is caused, while a color shift occurs with the light of a specific wavelength where constructive interference is made. In addition, in the case of the light emitting element 160 in which the microcavity is implemented, luminance in a front direction can increase, but luminance in a lateral direction can decrease.

The encapsulation unit 180 for protecting the light emitting element 160, which can be vulnerable to moisture from being exposed to moisture, can be formed on the light emitting element 160. The encapsulation unit 180 can block oxygen and moisture from penetrating into the light emitting display device 100 from the outside.

For example, when a light emitting display device is exposed to moisture or oxygen, a pixel shrinkage phenomenon in which the emission area is reduced can occur or a black spot can occur in the emission area. Accordingly, the encapsulation unit 180 protects the light emitting display device 100 by blocking oxygen and moisture. For example, the encapsulation unit 180 can have a structure in which an inorganic layer and an organic layer are alternately stacked, but is not limited thereto.

Referring to FIG. 2, the encapsulation unit 180 includes a first encapsulation layer 181, a foreign material cover layer 182, and a second encapsulation layer 183.

The first encapsulation layer 181 can be disposed on the second electrode 163 and suppress penetration of moisture or oxygen. The first encapsulation layer 181 can be formed of an inorganic material such as silicon nitride (SiNx), silicon oxynitride (SiNxOy), or aluminum oxide (AlyOz), but is not limited thereto. The first encapsulation layer 181 can be formed of a material having a refractive index higher than that of the foreign material cover layer 182.

The foreign material cover layer 182 is disposed on the first encapsulation layer 181 and planarizes a surface thereof. Also, the foreign material cover layer 182 can cover foreign materials or particles that can be generated during a manufacturing process. The foreign material cover layer 182 can be formed of an organic material, for example, silicon oxycarbon (SiOxCz), acrylic or epoxy-based resin, but is not limited thereto.

The second encapsulation layer 183 is disposed on the foreign material cover layer 182, and can suppress or prevent penetration of moisture or oxygen like into the first encapsulation layer 181. The second encapsulation layer 183 can be formed of an inorganic material such as silicon nitride (SiNx), silicon oxynitride (SiNxOy), silicon oxide (SiOx), or aluminum oxide (AlyOz), but is not limited thereto. The second encapsulation layer 183 can be formed of the same material as or a different material from the first encapsulation layer 181.

Referring to FIG. 2, the color filters 190 are disposed on the encapsulation unit 180. The color filters 190 can be disposed to overlap the first electrodes 161 exposed by the banks 170. For example, the color filter 190 can be disposed to overlap an entire area of the first electrode 161 exposed by the banks 170, for example, the opening area, and can be disposed to overlap an entire area of the emission area EA.

The color filters 190 can include a blue color filter overlapping the emission area BEA of the blue sub-pixel SPB, a red color filter overlapping the emission area REA of the red sub-pixel SPR, and a green color filter overlapping the emission area GEA of the green sub-pixel SPG. In addition, the blue color filter can overlap an entire area of the emission area BEA of the blue sub-pixel SPB, the red color filter can overlap an entire area of the emission area REA of the red sub-pixel SPR, and the green color filter can overlap an entire area of the emission area GEA of the green sub-pixel SPG.

The color filter 190 can be formed in a form in which pigment (dye) that absorbs light in a specific wavelength band is dispersed in a base resin. However, the present disclosure is not limited thereto, and the color filter 190 can be implemented with various materials. The color filter 190 allows only light in a specific wavelength band to be emitted and blocks light in an unwanted wavelength band not to be emitted, so that the amount of light extracted by passing through the color filter 190 can be less than the amount of light before passing through the color filter 190.

The color filter 190 can be formed to have a thickness of 0.2 μm to 0.5 μm. Transmittance of the color filter 190 can have a value of 80% to 90% according to a thickness of the color filter 190. Specifically, when the thickness of the color filter 190 is 0.22 μm, the transmittance is 90%, when the thickness is 0.33 μm, the transmittance is 85%, and when the thickness is 0.46 μm, the transmittance is 80%. For example, as the thickness of the color filter 190 increases, the transmittance decreases.

In the display device 100 according to an exemplary embodiment of the present disclosure, light extraction efficiency of the light emitting element 160 can be improved by using the second overcoating layer 150 having the protrusion portions 152. For example, in the display device 100 according to an exemplary embodiment of the present disclosure, the second overcoating layer 150 is configured to include the base portion 151 and the protrusion portions 152 protruding from the base portion 151, and the reflective layer of the first electrode 161 of the light emitting element 160 is disposed to cover the base portion 151 and at least side surfaces of the protrusion portions 152. Accordingly, light emitted with a low emission angle among light emitted from a light emitting layer of the light emitting display device 100 can be extracted to the outside by the first electrode 161 disposed on the side portion of the protrusion portion 152.

Accordingly, in the display device 100 according to an exemplary embodiment of the present disclosure, the first electrode 161 disposed on a side portion of the second overcoating layer 150 functions as a side mirror, so that light that can be lost in the display device can be extracted to the outside. Thus, light extraction efficiency can be improved and power consumption can be reduced.

Meanwhile, as described above, light that is emitted from the organic layer 162 to the outside can be classified into light (L1, first light) that is emitted from the emission area EA and reflected in the reflective area RA to be emitted, and light (L2, second light) that is emitted from the emission area EA and is emitted without being reflected in the reflective area RA.

For example, the bank 170 has an opening area exposing the first electrode and a non-opening area covering an end of the first electrode in the non-emission area, and the non-opening area includes a reflective area emitting the first light L1 and the opening area can be defined as an emission area emitting the second light L2.

First, the light L1 that is reflected and emitted from the reflective area RA is light that is reflected by the first electrode 161 disposed on the side portion of the protrusion portion 152 and is emitted to the outside. Since the first electrode 161 functions as a mirror, even when the light is emitted from the organic layer 162 in a lateral direction, it can be reflected by the first electrode 161 and emitted to the outside. In this case, since the light emitted laterally from the organic layer 162 is incident on the first electrode 161 at various angles, an emission angle of the light emitted by being reflected from the first electrode 161 can also vary.

Accordingly, since luminance according to a viewing angle (hereinafter, also referred to as "luminance viewing angle") of the light L1 that is reflected and emitted from the reflective area RA is relatively uniform, lateral visibility can be improved and relatively excellent. Here, when the luminance viewing angle is uniform or excellent, it preferably means that there is little or very little deviation in luminance that occurs as the viewing angle is changed.

On the other hand, the light L2 that is emitted from the emission area EA and is emitted without being reflected in the reflective area RA is emitted to the outside due to the microcavity effect. Since the light emitted from the organic layer 162 is repeatedly reflected between the first electrode 161 and the second electrode 163, constructive interference with respect to light of a specific wavelength is made, and the light of a specific wavelength is amplified by the constructive interference, and is emitted to the outside. Accordingly, by the light L2 that is emitted from the emission area EA and is emitted without being reflected in the reflective area RA, luminance in the front direction can increase but luminance in the lateral direction can decrease. Accordingly, the luminance viewing angle of the light L2 that is emitted from the emission area EA and is emitted without being reflected in the reflective area RA may be relatively unfavorable.

However, since the light L1 reflected and emitted from the reflective area RA passes through the bank 170 on the first electrode 161 disposed on the side portion of the protrusion portion 152, light in a specific region of a visible light wavelength band can be absorbed by banks 170. In this case, color coordinates of the light emitted from the emission area EA and the light reflected from the reflective area RA can be varied. For example, the color coordinates in the reflective area RA may be shifted to a longer wavelength compared to the color coordinates in the emission area EA. For this reason, a color difference between the reflective area RA and the emission area EA may occur in side view, and thus color gamut may not be satisfied, and accordingly, white light efficiency may be degraded.

Accordingly, in the display device 100 according to an exemplary embodiment of the present disclosure, the color filter 190 overlapping the emission area EA can be disposed to prevent color mixing between the reflective area RA and the emission area EA and to satisfy the color gamut. For example, by lowering luminance of only light emitted in the front, color mixing within one pixel is prevented, so that the luminance viewing angle can be improved and lateral visibility can be improved. In the case of light incident on the color filter 190, the amount of the light decreases while passing through the color filter 190. Accordingly, by disposing the color filter 190 only in the emission area EA, the amount of light that is directly emitted to the front of the emission area EA can be reduced. If the color filter 190 is disposed to cover both the emission area EA and the reflective area RA, a degree of reduction in the amount of light in the emission area EA and a degree of reduction in the amount of light in the reflective area RA are equal, and accordingly, a degree of reduction in luminance at a front view angle and a degree of reduction in luminance at a side view angle are equal to each other.

Accordingly, in the display device 100 according to an exemplary embodiment of the present disclosure, since the color filter 190 is disposed to overlap only the emission area EA among the emission area EA and the reflective area RA, the amount of light having a relatively unfavorable luminance viewing angle, which is the light L2 that is emitted from the emission area EA and is emitted without being reflected in the reflective area RA, can be reduced, and the amount of light having a relatively favorable luminance viewing angle, which is the light L1 that is reflected and emitted from the reflective area RA, can be maintained. Accordingly, in the display device 100 of the present disclosure, by disposing the color filter 190 overlapping the emission area EA, the amount of the light L1 reflected and emitted from the reflective area RA and the amount of the light L2 emitted without being reflected from the reflective area RA are adjusted, so that the luminance viewing angle can be improved and lateral visibility can be improved.

Hereinafter, effects of the display device 100 according to an exemplary embodiment will be described in detail with reference to FIGS. 3A and 3B.

Figure 3A:
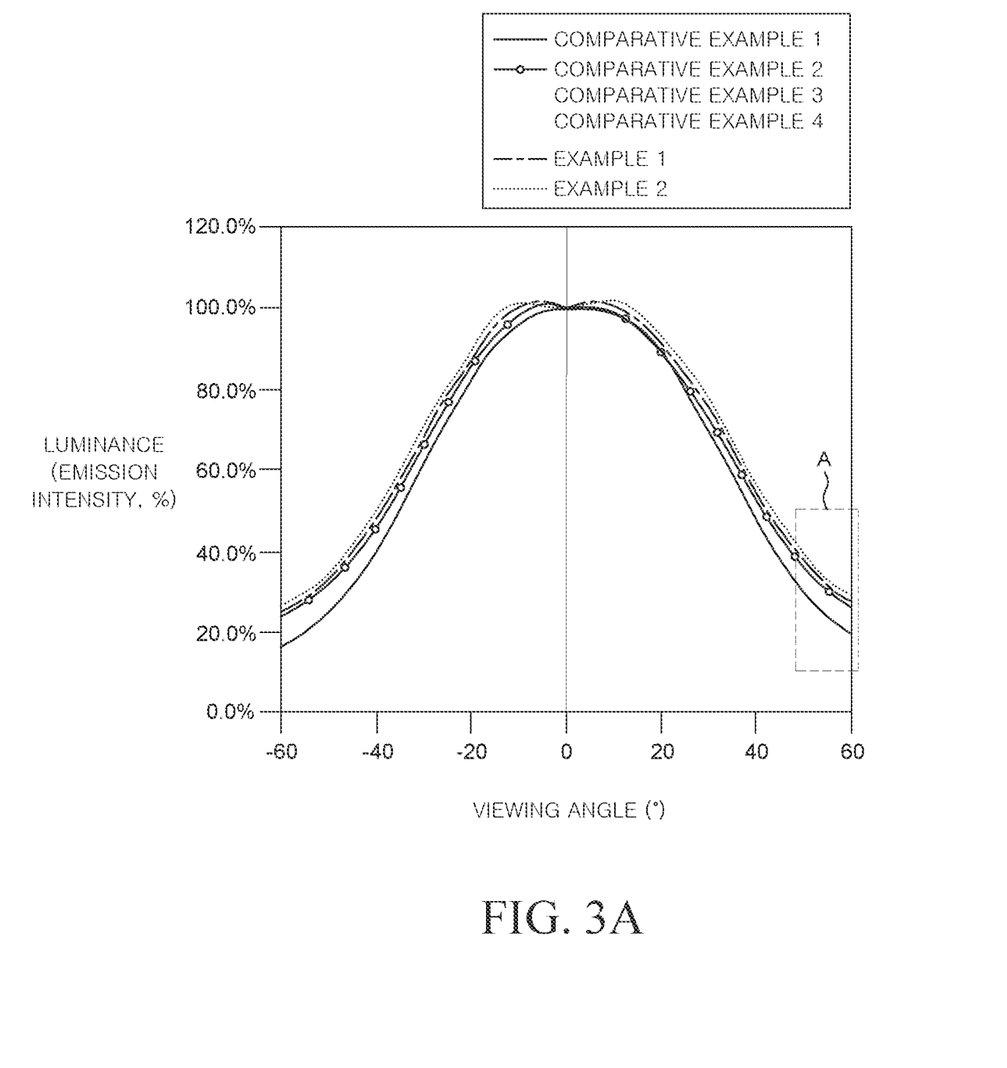
FIGS. 3A and 3B are graphs illustrating changes in luminance (emission intensity) according to changes in viewing angle in Comparative Examples and various Examples of the present disclosure.
Figure 3B:
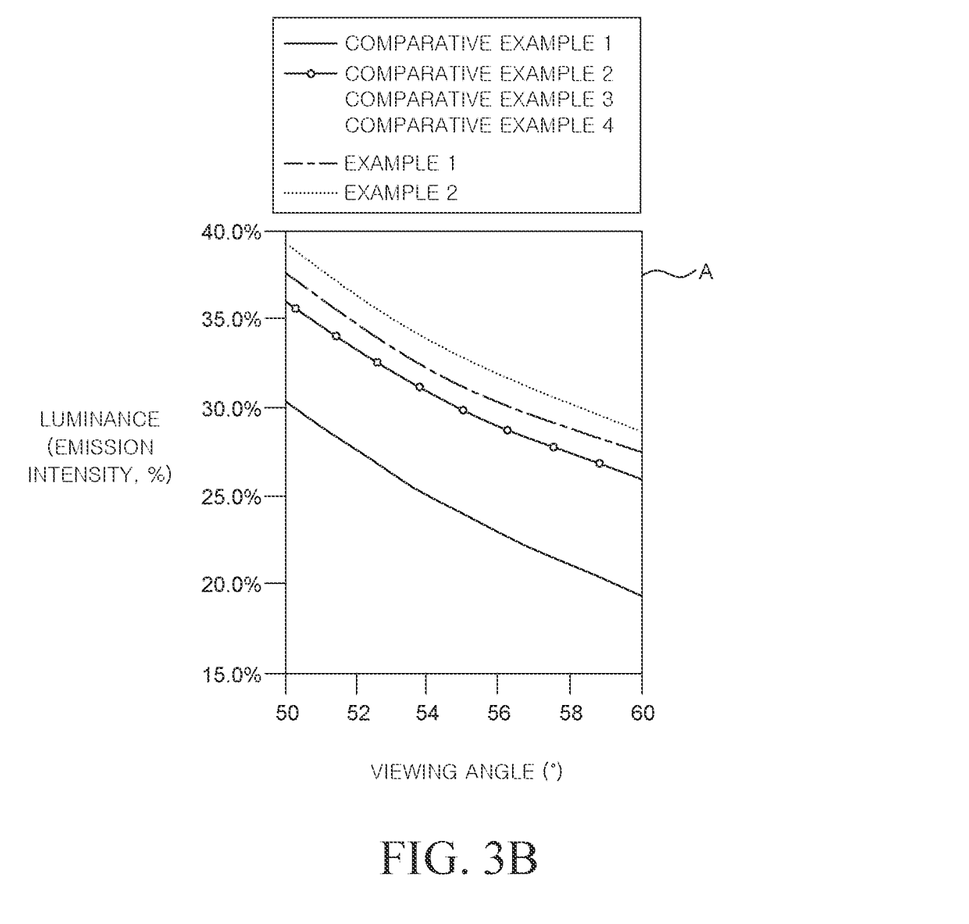

FIGS. 3A and 3B are graphs illustrating changes in luminance (emission intensity) according to changes in viewing angle in Comparative Examples and various Examples of the present disclosure.

In FIGS. 3A and 3B, an X-axis indicates a viewing angle (S), and a Y-axis indicates luminance (emission intensity, %). The luminance (%) is assumed that a luminance value at a viewing angle of 0° is 100%, and luminance values at other viewing angles are relative values with respect to the luminance value at the viewing angle of 0°. FIG. 3B is an enlarged view of area A of FIG. 3A, and is a graph illustrating a change in luminance at a viewing angle of 50° to 60°.

Example 1 is a case in which as in the display device 100 according to an exemplary embodiment of the present disclosure, the color filter 190 is disposed only in the emission area EA and the color filter 190 is not disposed in the reflective area RA and in this case, the transmittance of the color filter 190 is 95%.

Example 2 is a case in which as in the display device 100 according to an exemplary embodiment of the present disclosure, the color filter 190 is disposed only in the emission area EA and the color filter 190 is not disposed in the reflective area RA and in this case, the transmittance of the color filter 190 is 90%.

Comparative Example 1 is a case in which the second overcoating layer has no protrusion portion and thus, the reflective area that is an area corresponding to a side surface of the bank on which the first electrode is disposed, does not exist in the display device 100 according to an exemplary embodiment of the present disclosure, and in this case, the color filter is not disposed.

Comparative Example 2 is a case in which the color filter is not disposed in the display device 100 according to an exemplary embodiment of the present disclosure.

Comparative Example 3 is a case in which the color filter is disposed in the reflective area as well as the emission area of the display device 100 according to an exemplary embodiment of the present disclosure, and the transmittance of the color filter is 95%.

Comparative Example 4 is a case in which the color filter is disposed in the reflective area as well as the emission area of the display device 100 according to an exemplary embodiment of the present disclosure, and the transmittance of the color filter is 90%.

Referring to FIGS. 3A and 3B, Comparative Example 1 is a display device having no reflective area and has a lowest luminance viewing angle. In the case of Comparative Example 1, there is no light that is reflected from the reflective area and emitted to the outside, and there exists only light that is emitted from the emission area and is emitted without being reflected from the reflective area. As described above, in Comparative Example 1, the light that is emitted to the outside can have an improvement in luminance at a front of the display device due to the microcavity effect, but the luminance at a lateral side of the display device can be decreased. Accordingly, in Comparative Example 1, a luminance value of 30% at a viewing angle of 50° and a luminance value of 20% at a viewing angle of 60° as compared to the viewing angle of 0° are obtained.

Comparative Example 2 is a display device further including a reflective area compared to Comparative Example 1. As the reflective area is further included, compared to Comparative Example 1, light reflected from the reflective area and emitted to the outside is further added. In addition, since the light reflected from the reflective area and emitted to the outside has an excellent luminance viewing angle, the luminance viewing angle thereof can be improved compared to Comparative Example 1. Accordingly, in Comparative Example 2, a luminance value of 36% at a viewing angle of 50° and a luminance value of 25% at a viewing angle of 60° as compared to the viewing angle of 0° are obtained.

Comparative Example 3 and Comparative Example 4 are display devices in which a color filter is further included compared to Comparative Example 2, and the color filter is included in both the emission area and the reflective area. As the color filter is disposed in both the emission area and the reflective area, transmittance of all light that is emitted from the light emitting element and emitted to the outside is reduced by the color filters. For example, when the transmittance of the color filter is 95% as in Comparative Example 3, the light emitted in Comparative Example 3 is 95% of the light emitted in Comparative Example 2, but a change in luminance according to a viewing angle is identical to that in Comparative Example 2. In the same manner, when the transmittance of the color filter is 90% as in Comparative Example 4, the light emitted in Comparative Example 4 is 90% of the light emitted in Comparative Example 2, but a change in luminance according to the viewing angle is identical to that in Comparative Example 2. Accordingly, graphs showing changes in luminance according to changes in the viewing angle in Comparative Example 3 and 4 are identical to that in Comparative Example 2.

In Example 1, the reflective area RA is included, but the color filter 190 is disposed only in the emission area EA, and the color filter 190 is not disposed in the reflective area RA. The amount of light emitted in the front is reduced by the color filter 190 while the amount of light emitted laterally is maintained, among the light emitted from the organic layer 162. As such, a difference between the luminance at the front and the luminance at the lateral side is also reduced. Accordingly, Example 1 has an improvement in luminance viewing angle compared to the Comparative Examples, and has a luminance value of 38% at a viewing angle of 50° and a luminance value of 27% at a viewing angle of 60° compared to the viewing angle of 0°.

In Example 2, the transmittance of the color filter 190 is 90%, which is lower than Example 1 in which the transmittance of the color filter 190 is 95%. The amount of light emitted in the front among the light emitted from the organic layer 162 is further reduced compared to Example 1. Accordingly, Example 2 has an improvement in luminance viewing angle compared to Example 1, and has a luminance value of 40% at a viewing angle of 50° and a luminance value of 29% at a viewing angle of 60° compared to the viewing angle of 0°.

Therefore, since the luminance viewing angles of Example 1 and Example 2 are improved compared to the Comparative Examples, it can be confirmed that when the color filter 190 is present only in the emission area EA, the luminance viewing angle is excellent and lateral visibility can be improved.

Figure 4:
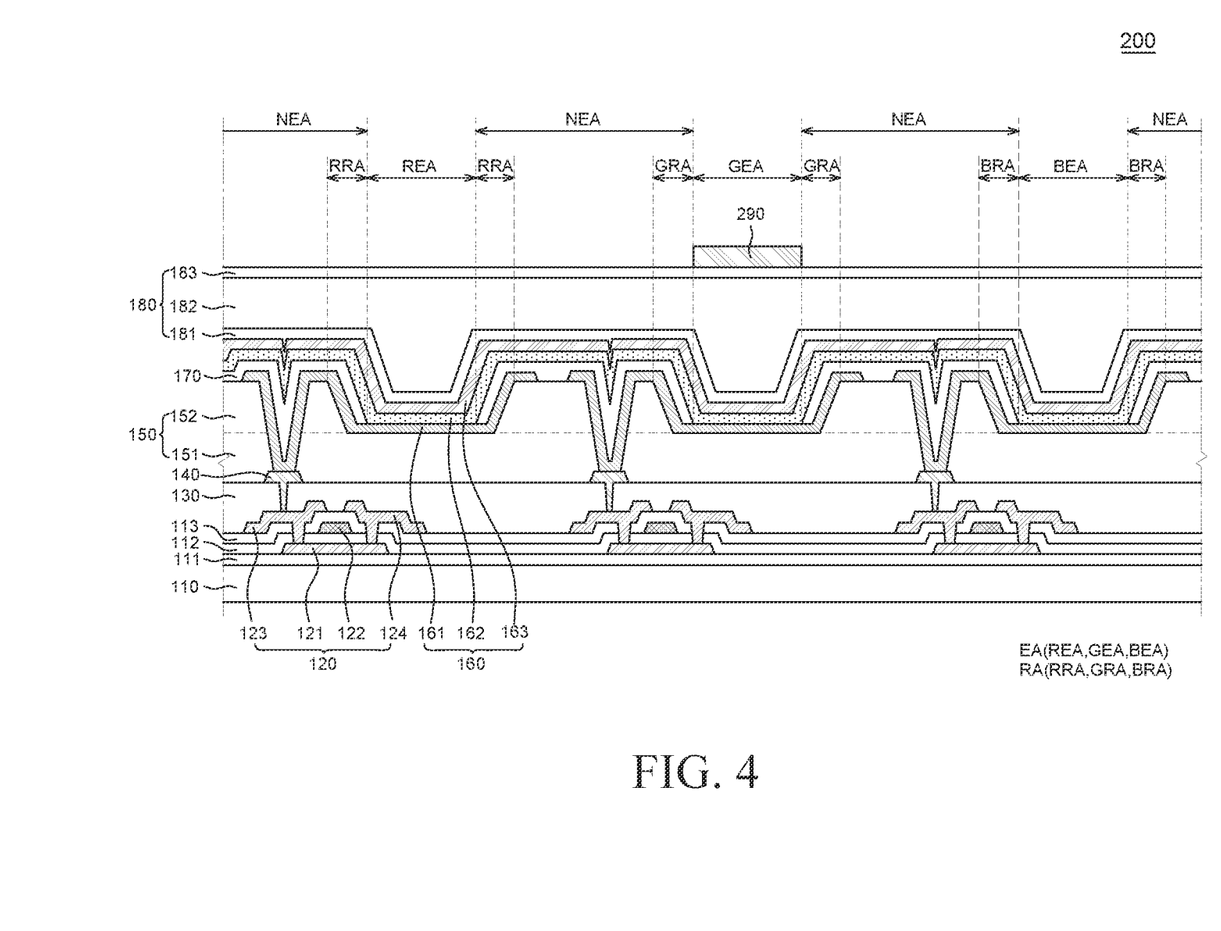
FIG. 4 is a cross-sectional view of a display device according to another exemplary embodiment of the present disclosure.

FIG. 4 is a cross-sectional view of a display device 200 according to another exemplary embodiment of the present disclosure. Other configurations of the display device 200 of FIG. 4 are substantially identical to those of the display device 100 of FIGS. 1 and 2 with the exception that a color filter 290 is disposed only in the green emission area GEA, and thus, a redundant description thereof will be omitted or may be briefly.

Referring to FIG. 4, the color filter 290 is disposed on the encapsulation unit 180. The color filter 290 can be disposed to overlap the first electrode 161 exposed by the bank 170. For example, the color filter 290 can be disposed to overlap an entire area of the first electrode 161 that is exposed by the bank 170, and can be disposed over an entire area of the emission area EA.

Referring to FIG. 4, the color filter 290 is disposed only on an upper portion of the green sub-pixel SPG. For example, the color filter 290 includes only a green color filter overlapping the emission area GEA of the green sub-pixel SPG, and may not include a blue color filter overlapping the emission area BEA of the blue sub-pixel SPB and a red color filter overlapping the emission area REA of the red sub-pixel SPR. Also, the green color filter can overlap an entire area of the emission area GEA of the green sub-pixel SPG.

In the display device 200 according to another exemplary embodiment of the present disclosure, by disposing the color filter 290 overlapping the emission area GEA of the green sub-pixel SPG, luminance of only light emitted in the front is lowered, so that a luminance viewing angle can be improved, and lateral visibility can be improved. In addition, in the display device 200 according to another exemplary embodiment of the present disclosure, by disposing the color filter 290 only in the emission area GEA of the green sub-pixel SPG, luminance of only light emitted in a front of the green sub-pixel SPG is lowered, so that a luminance viewing angle for white color can be improved, and lateral visibility can be improved. In general, when white light is implemented using the red sub-pixel SPR, the green sub-pixel SPG, and the blue sub-pixel SPG, a ratio of green light emitted from the green sub-pixel SPG is greatest. Accordingly, in the case of white light, a luminance viewing angle of the green sub-pixel SPG among the red sub-pixel SPR, the green sub-pixel SPG, and the blue sub-pixel SPB can have a greatest effect on the luminance viewing angle for the white light.

In addition, the luminance viewing angle of the green sub-pixel SPG is not relatively uniform compared to luminance viewing angles of the red sub-pixel SPR and the blue sub-pixel SPB. Accordingly, in the display device 200 according to another exemplary embodiment of the present disclosure, by disposing the color filter 290 only in the emission area GEA of the green sub-pixel SPG among the plurality of sub-pixels SP, luminance of light coming out of from the front of the green sub-pixel SPG is lowered, the luminance viewing angle for white color can be improved, and lateral visibility can be improved.

Figure 5:
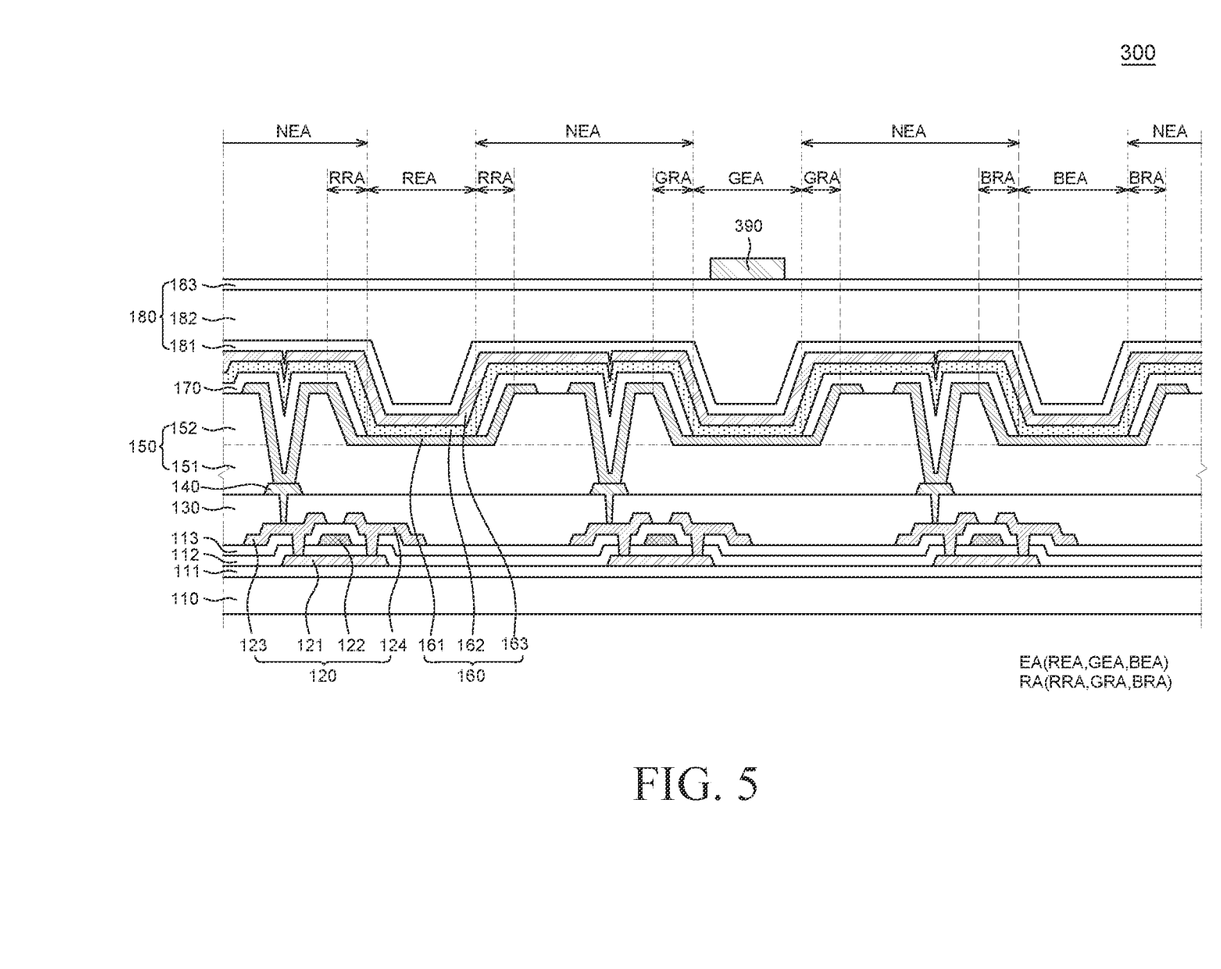
FIG. 5 is a cross-sectional view of a display device according to still another exemplary embodiment of the present disclosure.

FIG. 5 is a cross-sectional view of a display device 300 according to still another exemplary embodiment of the present disclosure. Other configurations of the display device 300 of FIG. 5 are substantially identical to those of the display device 200 of FIG. 4 with the exception that a color filter 390 is disposed only on a partial area of the green emission area GEA, and thus, a redundant description thereof will be omitted or may be briefly provided.

Referring to FIG. 5, the color filter 390 is disposed on the encapsulation unit 180. The color filter 390 can be disposed to overlap the first electrode 161 exposed by the bank 170. The color filter 390 can be disposed only on an upper portion of the green sub-pixel SPG. For example, the color filter 390 includes only a green color filter overlapping the emission area GEA of the green sub-pixel SPG, and may not include a blue color filter overlapping the emission area BEA of the blue sub-pixel SPB and a red color filter overlapping the emission area REA of the red sub-pixel SPR.

The color filter 390 can be disposed only in a portion of the emission area EA. For example, the color filter 390 can overlap only a portion of the area of the first electrode 161 exposed by the bank 170. Accordingly, referring to FIG. 5, the color filter 390 can overlap only a portion of the emission area GEA of the green sub-pixel SPG.

In the display device 300 according to still another exemplary embodiment of the present disclosure, by disposing the color filter 390 overlapping the emission area GEA of the green sub-pixel SPG, luminance of only light emitted in the front is lowered, so that a luminance viewing angle can be improved, and lateral visibility can be improved. In addition, in the display device 300 according to still another exemplary embodiment of the present disclosure, by disposing the color filter 390 only in a portion of the emission area GEA of the green sub-pixel SPG, luminance of only light emitted in the front of the green sub-pixel SPG is lowered, so that a luminance viewing angle for white color can be improved, and lateral visibility can be improved. In this case, in the display device 300 according to still another exemplary embodiment of the present disclosure, transmittance of light emitted in a front direction can be adjusted by adjusting an area of the color filter 390 disposed in the emission area GEA of the green sub-pixel SPG, so that a desired luminance viewing angle can be provided.

Figure 6:
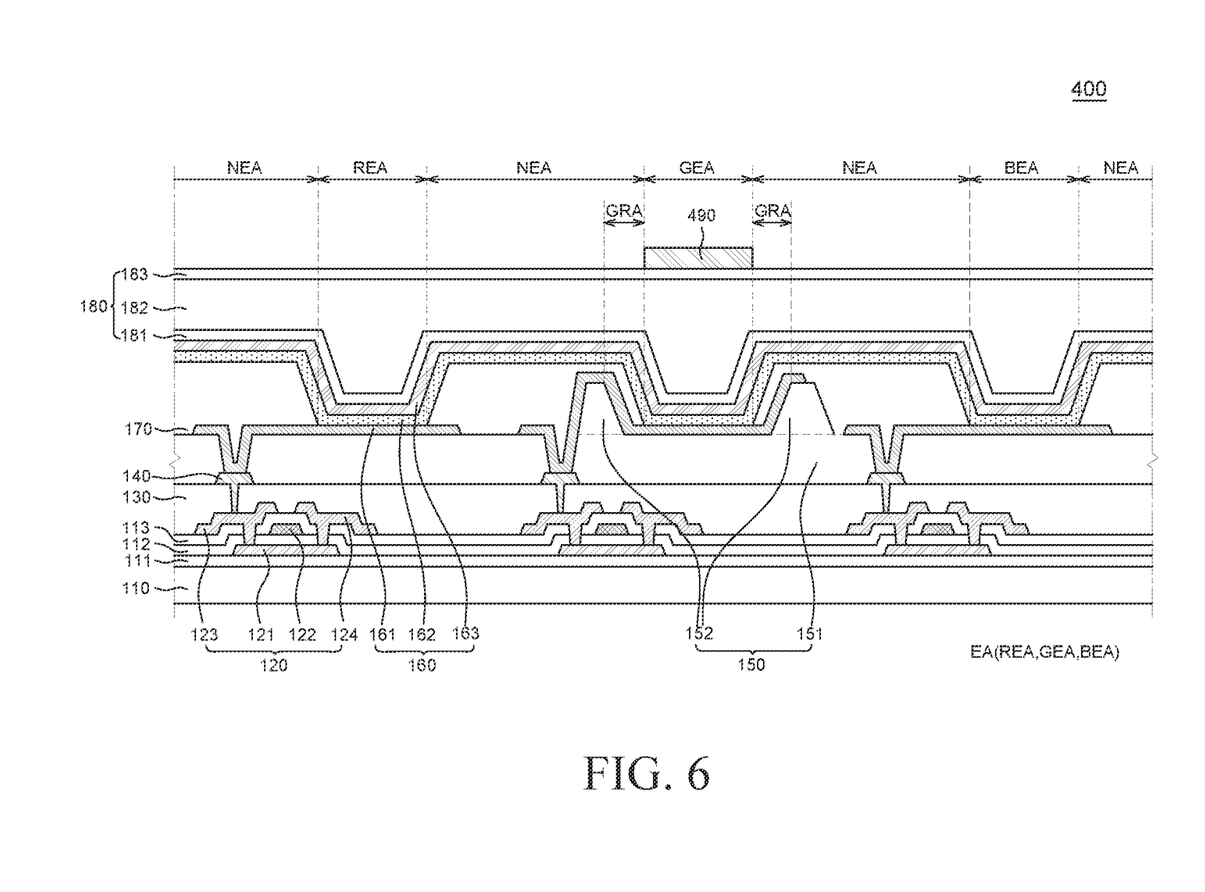
FIG. 6 is a cross-sectional view of a display device according to yet another exemplary embodiment of the present disclosure.

FIG. 6 is a cross-sectional view of a display device 400 according to yet another exemplary embodiment of the present disclosure. Other configurations of the display device 400 of FIG. 6 are substantially identical to those of the display device 200 of FIG. 4 with the exception that the red sub-pixel SPR and the blue sub-pixel SPB do not have a reflective area, and thus, a redundant description thereof will be omitted or may be briefly provided.

Referring to FIG. 6, a color filter 490 is disposed only on an upper portion of the green sub-pixel SPG. For example, the color filter 490 includes only a green color filter overlapping the emission area GEA of the green sub-pixel SPG, and may not include a blue color filter overlapping the emission area BEA of the blue sub-pixel SPB and a red color filter overlapping the emission area REA of the red sub-pixel SPR. Also, the green color filter can overlap an entire area of the emission area GEA of the green sub-pixel SPG.

However, referring to FIG. 6, the second overcoating layer 150 includes the base portion 151 and the plurality of protrusion portions 152, but the plurality of protrusion portions 152 are disposed only in the green sub-pixel SPG. For example, the plurality of protrusion portions 152 are not disposed in the red sub-pixel SPR and the blue sub-pixel SPB. Accordingly, since the first electrode 161 is disposed to cover the base portion 151 and the plurality of protrusion portions 152, the first electrode 161 can be disposed on the upper surface of the base portion 151 on which the protrusion portions 152 are not disposed and the side surfaces of the plurality of protrusion portions 152 in the green sub-pixel SPG, and the first electrode 161 is disposed only on the upper surface of the base portion 151 in the red sub-pixel SPR and the blue sub-pixel SPG. For example, the green sub-pixel SPG has the reflective area GRA of the green sub-pixel SPG because the first electrode 161 is disposed along the shapes of the plurality of protrusion portions 152, but in the red sub-pixel SPR and the blue sub-pixel SPG, the plurality of protrusion portions 152 do not exist and thus, the reflective areas RRA and BRA do not exist.

In general, when white light is implemented using the red sub-pixel SPR, the green sub-pixel SPG, and the blue sub-pixel SPG, a ratio of green light emitted from the green sub-pixel SPG is greatest. Accordingly, in the case of white light, a luminance viewing angle of the green sub-pixel SPG among the red sub-pixel SPR, the green sub-pixel SPG, and the blue sub-pixel SPB can have a greatest effect on the luminance viewing angle for the white light. In addition, the luminance viewing angle of the green sub-pixel SPG is not relatively uniform compared to luminance viewing angles of the red sub-pixel SPR and the blue sub-pixel SPB.

Accordingly, in the display device 400 according to yet another exemplary embodiment of the present disclosure, the reflective area GRA is formed only in the green sub-pixel SPG among the plurality of sub-pixels SP, and the color filter 490 can be disposed only in an entire area of the emission area GEA of the green sub-pixel SPG. For example, the reflective area is not formed in the red sub-pixel SPR and the blue sub-pixel SPB among the plurality of sub-pixels SP. Accordingly, by lowering the luminance of only the light emitted from the front of the green sub-pixel SPG, a luminance viewing angle for white color can be improved, and lateral visibility can be improved.

Hereinafter, effects of the display device 400 according to yet another exemplary embodiment of the present disclosure will be described in detail with reference to Table 1 below. Table 1 is a table in which luminance values according to changes in viewing angle in Comparative Examples and various Examples of the present disclosure are summarized.

Here, the luminance (%) is 100% of a luminance value at a viewing angle of 0°, and luminance values at other viewing angles are relative values with respect to the luminance value at the viewing angle of 0°.

Comparative Example 1 is a case in which the second overcoating layer has no protrusion portion and thus, the reflective area that is an area corresponding to a side surface of the bank on which the first electrode is disposed, does not exist in the display device 200 according to another exemplary embodiment of the present disclosure, and in this case, the color filter is not disposed.

Comparative Example 2 is a case in which a color filter is not disposed in the display device 200 according to another exemplary embodiment of the present disclosure.

Comparative Example 3 is a case in which a color filter is not disposed in the display device 400 according to yet another exemplary embodiment of the present disclosure.

Example 1 is a case in which as in the display device 400 according to yet another exemplary embodiment of the present disclosure, the reflective area GRA exists only in the green sub-pixel SPG, the color filter 490 is disposed only in the emission area GEA of the green sub-pixel SPG and the color filter 490 is not disposed in the reflective area GRA of the green sub-pixel SPG, and transmittance of the color filter 490 is 90%. In this case, a thickness of the color filter 490 is 0.22 μm.

Example 2 is a case in which as in the display device 400 according to yet another exemplary embodiment of the present disclosure, the reflective area GRA exists only in the green sub-pixel SPG, the color filter 490 is disposed only in the emission area GEA of the green sub-pixel SPG and the color filter 490 is not disposed in the reflective area GRA of the green sub-pixel SPG, and transmittance of the color filter 490 is 85%. In this case, the thickness of the color filter 490 is 0.33 μm.

Example 3 is a case in which as in the display device 400 according to yet another exemplary embodiment of the present disclosure, the reflective area GRA exists only in the green sub-pixel SPG, the color filter 490 is disposed only in the emission area GEA of the green sub-pixel SPG and the color filter 490 is not disposed in the reflective area GRA of the green sub-pixel SPG, and transmittance of the color filter 490 is 80%. In this case, the thickness of the color filter 490 is 0.46 μm.

Referring to Table 1 below, Comparative Example 1 is a display device having no reflective area and has a lowest luminance viewing angle. In Comparative Example 1, there is no light that is reflected from the reflective area and emitted to the outside, and there exists only light that is emitted from the emission area and is emitted without being reflected from the reflective area. As described above, in Comparative Example 1, the light that is emitted to the outside can have an improvement in luminance at a front of the display device due to the microcavity effect, but the luminance at a lateral side of the display device can be decreased. Accordingly, in Comparative Example 1, a luminance value of 69.8% at a viewing angle of 30°, a luminance value of 38.2% at a viewing angle of 45°, and a luminance value of 19.4% at a viewing angle of 60° compared to the viewing angle of 0° are obtained.

Comparative Example 2 is a display device further including a reflective area compared to Comparative Example 1. As the reflective area is further included, compared to Comparative Example 1, light reflected from the reflective area and emitted to the outside is further added. In addition, since the light reflected from the reflective area and emitted to the outside has an excellent luminance viewing angle, the luminance viewing angle thereof can be improved compared to Comparative Example 1. Accordingly, in Comparative Example 2, a luminance value of 73% at a viewing angle of 30°, a luminance value of 43% at a viewing angle of 45°, and a luminance value of 26% at a viewing angle of 60° compared to the viewing angle of 0° are obtained.

Comparative Example 3 is a display device further including the reflective area GRA only in the green sub-pixel SPG, and the red sub-pixel SPR and the blue sub-pixel SPB do not include the reflective areas RRA and BRA, as compared to Comparative Example 1. As the reflective area GRA is further included in the green sub-pixel SPG, a luminance viewing angle is excellent compared to Comparative Example 1, but is inferior to Comparative Example 2 in which all of the sub-pixels have the reflective area. Accordingly, in Comparative Example 3, a luminance value of 72.6% at a viewing angle of 30°, a luminance value of 42.4% at a viewing angle of 45°, and a luminance value of 23.9% at a viewing angle of 60° compared to the viewing angle of 0° are obtained.

Example 1, Example 2, and Example 3 are display devices in which a color filter is further included in the green sub-pixel SPG compared to Comparative Example 3. For example, in Example 1, Example 2, and Example 3, the reflective area GRA of the green sub-pixel SPG is included, but the color filter 490 is disposed only in the emission area GEA of the green sub-pixel and the green color filter 490 is not disposed in the reflective area GRA of the green sub-pixel. Accordingly, the amount of light emitted in the front is reduced by the color filter 490 while the amount of light emitted laterally is maintained, among the light emitted from the organic layer 162. Accordingly, a difference between the luminance at the front and the luminance at the lateral side is also reduced. Accordingly, Example 1 has an improvement in luminance viewing angle compared to the Comparative Examples, and has a luminance value of 77.76% at a viewing angle of 30°, a luminance value of 47.3% at a viewing angle of 45°, and a luminance value of 28.78% at a viewing angle of 60° compared to the viewing angle of 0°.

In Example 2, the transmittance of the color filter 490 is 85%, which is lower than Example 1 in which the transmittance of the color filter 490 is 90%. Accordingly, the amount of light emitted in the front among the light emitted from the organic layer 162 of the green sub-pixel SPG is reduced more than in Example 1. Therefore, Example 2 has an improvement in luminance viewing angle compared to Comparative Example 1 and has a luminance value of 80.8% at a viewing angle of 30°, a luminance value of 49.6% at a viewing angle of 45°, and a luminance value of 30.5% at a viewing angle of 60° compared to the viewing angle of 0°.

In Example 3, the transmittance of the color filter 490 is 80%, which is lower than Example 2 in which the transmittance of the color filter 490 is 85%. Accordingly, the amount of light emitted from the front of the light emitted from the organic layer 162 of the green sub-pixel SPG is reduced more than in Example 2. Therefore, Example 3 has an improvement in luminance viewing angle compared to Comparative Example 2 and has a luminance value of 84.2% at a viewing angle of 30°, a luminance value of 52.1% at a viewing angle of 45°, and a luminance value of 32.4% at a viewing angle of 60° compared to the viewing angle of 0°.

TABLE 1

| Viewing Angle | Comparative Example 1 | Comparative Example 2 | Comparative Example 3 | Example 1 | Example 2 | Example 3 |
|---|---|---|---|---|---|---|
| 0° | 100.0% | 100.0% | 100.0% | 100.0% | 100.0% | 100.0% |
| 30° | 69.8% | 73.0% | 72.6% | 77.76% | 80.8% | 84.2% |
| 45° | 38.2% | 43.0% | 42.4% | 47.30% | 49.6% | 52.1% |
| 60° | 19.4% | 26.0% | 23.9% | 28.78% | 30.5% | 32.4% |

Thus, since the luminance viewing angles of Example 1, Example 2, and Example 3 are improved compared to the Comparative Examples, when the reflective area GRA is formed only in the green sub-pixel SPG among the plurality of sub-pixels and the color filter 490 having a transmittance of 90% to 80% is disposed to overlap only the emission area GEA of the green sub-pixel SPG, it can be confirmed that luminance of the light emitted in the front of the green sub-pixel SPG is lowered, so that the luminance viewing angle is excellent and lateral visibility can be improved.

However, when the transmittance of the color filter 490 exceeds 90%, it is difficult to uniformly arrange the color filter 490 due to a limitation in a process because its thickness decreases, and when the transmittance of the color filter 490 is less than 80%, it may not be appropriate since the overall light efficiency decreases as luminance decreases in accordance with an increase in the thickness. In addition, when the color filter 490 is disposed to cover both the emission area GEA and the reflective area GRA, a degree of reduction of the amount of light in emission area GEA and a degree of reduction of the amount of light in the reflective area GRA are equal, and thus, a degree of reduction in luminance at a front view angle and a degree of reduction in luminance at a side view angle are equal to each other, whereby effects of the Examples cannot be expected.

The exemplary embodiments of the present disclosure can also be described as follows:

According to an aspect of the present disclosure, a display device can include a substrate including a plurality of sub-pixels, an overcoating layer on the substrate and including a base portion and protrusion portions, a first electrode corresponding to each of the plurality of sub-pixels and covering the base portion and the protrusion portions, a bank on a portion of the first electrode, an organic layer on the first electrode and the bank, a second electrode on the organic layer, an encapsulation unit on the second electrode, and a color filter on the encapsulation unit. The color filter overlaps another portion of the first electrode that is exposed by the bank.

The plurality of sub-pixels can include a red sub-pixel, a green sub-pixel, and a blue sub-pixel, and the color filter can be disposed in the green sub-pixel among the plurality of sub-pixels.

The color filter can overlap an entire area of the another portion of the first electrode that is exposed by the bank.

The color filter can overlap a partial area of the another portion of the first electrode that is exposed by the bank.

The color filter can have a transmittance of 80% to 90%.

The color filter can have a thickness of 0.2 μm to 0.5 μm.

According to another aspect of the present disclosure, a display device can include a substrate on which a plurality of sub-pixels including an emission area and a non-emission area are defined, a planarization layer on the substrate and including a base portion and a plurality of protrusion portions, a plurality of light emitting elements on the plurality of sub-pixels on the substrate and including a first electrode, a second electrode, and a light emitting layer disposed between the first electrode and the second electrode, a bank covering an end of the first electrode in the non-emission area, a foreign material cover layer on the second electrode, and a color filter on a portion of the foreign material cover layer. The color filter overlaps only the emission area.

The plurality of sub-pixels can include a red sub-pixel, a green sub-pixel, and a blue sub-pixel, and the color filter can be disposed in the green sub-pixel among the plurality of sub-pixels.

The color filter can have a transmittance of 80% to 90%.

The color filter can have a thickness of 0.2 μm to 0.5 μm.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a substrate including a plurality of sub-pixels;
an overcoating layer on the substrate and including a base portion and a plurality of protrusion portions;
a first electrode corresponding to each of the plurality of sub-pixels and covering the base portion and the plurality of protrusion portions;
a bank on a portion of the first electrode;
an organic layer on the first electrode and the bank;
a second electrode on the organic layer;
an encapsulation unit on the second electrode; and
a color filter on the encapsulation unit,
wherein the color filter overlaps another portion of the first electrode that is exposed by the bank,
wherein the plurality of sub-pixels includes an emission area and a non-emission area,
wherein the bank has an opening area exposing the first electrode and a non-opening area covering an end of the first electrode in the non-emission area,
wherein the non-opening area of the bank includes a reflective area configured to emit a first light,
wherein the opening area of the bank corresponds to the emission area configured to emit a second light, and
wherein the color filter does not overlap the reflective area of the bank.

2. The display device of claim 1, wherein the plurality of sub-pixels include a red sub-pixel, a green sub-pixel, and a blue sub-pixel, and wherein the color filter is disposed in the green sub-pixel among the plurality of sub-pixels.

3. The display device of claim 2, wherein the color filter overlaps an entire area of the another portion of the first electrode that is exposed by the bank.

4. The display device of claim 2, wherein the color filter overlaps a partial area of the another portion of the first electrode that is exposed by the bank.

5. The display device of claim 2, wherein the color filter has a transmittance of about 80% to 90%.

6. The display device of claim 5, wherein the color filter has a thickness of about 0.2 μm to 0.5 μm.

7. A display device, comprising:
- a substrate on which a plurality of sub-pixels including an emission area and a non-emission area are defined;
- a planarization layer on the substrate and including a base portion and a plurality of protrusion portions;
- a plurality of light emitting elements on the plurality of sub-pixels on the substrate, and including a first electrode, a second electrode, and a light emitting layer disposed between the first electrode and the second electrode;
- a bank covering an end of the first electrode in the non-emission area;
- a foreign material cover layer on the second electrode; and
- a color filter on a portion of the foreign material cover layer,
- wherein the bank has an opening area exposing the first electrode and a non-opening area covering the end of the first electrode in the non-emission area,
- wherein the non-opening area of the bank includes a reflective area configured to emit a first light,
- wherein the opening area of the bank corresponds to the emission area configured to emit a second light, and
- wherein the color filter does not overlap the reflective area of the bank.

8. The display device of claim 7, wherein the plurality of sub-pixels include a red sub-pixel, a green sub-pixel, and a blue sub-pixel, and
wherein the color filter is disposed in the green sub-pixel among the plurality of sub-pixels.

9. The display device of claim 8, wherein the color filter has a transmittance of about 80% to 90%.

10. The display device of claim 9, wherein the color filter has a thickness of about 0.2 μm to 0.5 μm.

11. The display device of claim 7, wherein the first electrode is disposed along shapes of the base portion and the plurality of protrusion portions of the planarization layer.

12. The display device of claim 1, wherein the bank does not overlap the color filter.

13. The display device of claim 1, wherein the first electrode and the organic layer are in contact with each other in the emission area, and
wherein the first electrode and the organic layer are spaced apart from each other by the bank in the non-emission area.

14. The display device of claim 1, wherein the first electrode is disposed to cover a side surface of the plurality of protrusion portions in the reflective area.

15. The display device of claim 1, wherein the bank includes an inorganic material.

16. The display device of claim 1, wherein the first electrode includes a reflective layer formed of a metallic material.

17. The display device of claim 7, wherein the first electrode includes a reflective layer formed of a metallic material.

18. The display device of claim 7, wherein the first electrode is disposed to cover a side surface of the plurality of protrusion portions in the reflective area.

19. The display device of claim 7, wherein the bank does not overlap the color filter.

20. The display device of claim 7, wherein the bank includes an inorganic material.

* * * * *